United States Patent
Miyakoshi et al.

(10) Patent No.: US 9,784,769 B2
(45) Date of Patent: Oct. 10, 2017

(54) CURRENT SENSOR

(71) Applicant: AISIN SEIKI KABUSHIKI KAISHA, Kariya-shi (JP)

(72) Inventors: Takaaki Miyakoshi, Kariya (JP); Noriaki Fujita, Chita-gun (JP); Shinsuke Fushimi, Nishio (JP)

(73) Assignee: AISIN SEIKI KABUSHIKI KAISHA, Kariya-shi (JP)

( * ) Notice: Subject to any disclaimer, the term of this patent is extended or adjusted under 35 U.S.C. 154(b) by 0 days.

(21) Appl. No.: 14/949,014

(22) Filed: Nov. 23, 2015

(65) Prior Publication Data
US 2016/0146858 A1    May 26, 2016

(30) Foreign Application Priority Data
Nov. 26, 2014    (JP) ................................ 2014-238941

(51) Int. Cl.
G01R 33/00    (2006.01)
G01R 33/04    (2006.01)
G01R 15/20    (2006.01)

(52) U.S. Cl.
CPC ................................ *G01R 15/207* (2013.01)

(58) Field of Classification Search
CPC ....................................................... G01R 15/20
USPC ...................................... 324/117 R, 253, 260
See application file for complete search history.

(56) References Cited

U.S. PATENT DOCUMENTS

| | | | |
|---|---|---|---|
| 2010/0207625 A1* | 8/2010 | Ueno | G01R 15/20 324/260 |
| 2012/0217964 A1 | 8/2012 | Iizuka et al. | |
| 2013/0187633 A1* | 7/2013 | Yasui | G01R 15/207 324/117 R |

FOREIGN PATENT DOCUMENTS

| | | |
|---|---|---|
| JP | 2011-112604 | 6/2011 |
| JP | 2012-177616 | 9/2012 |

* cited by examiner

*Primary Examiner* — Farhana Hoque
(74) *Attorney, Agent, or Firm* — Oblon, McClelland, Maier & Neustadt, L.L.P.

(57) ABSTRACT

A current sensor includes: a U-shaped core as a magnetic body; a conductor inserted into a slit of the core; and a detection element arranged in the slit of the core and detecting a magnetic field, wherein the core includes recessed portions on both side surfaces facing the detection element and the recessed portions have wall portions intersecting with at least an insertion direction of the conductor.

9 Claims, 8 Drawing Sheets

CURRENT SENSOR

CROSS REFERENCE TO RELATED APPLICATIONS

This application is based on and claims priority under 35 U.S.C. §119 to Japanese Patent Application 2014-238941, filed on Nov. 26, 2014, the entire contents of which are incorporated herein by reference.

TECHNICAL FIELD

This disclosure relates to a current sensor that measures a current which flows through a conductor.

BACKGROUND DISCUSSION

Hybrid vehicles and electric cars that are provided with motors and inverters have been supplied. It is important to measure a current that flows through the motor for rotation of the motor to be appropriately controlled. Methods for measuring the current include a current sensor that detects a magnetic flux which is generated around a bus bar connecting the motor and the inverter to each other as a result of a current applied to the bus bar with a detection element (magnetic sensor) and calculates and obtains the current applied to the bus bar based on the detected magnetic flux (for example, refer to JP 2011-112604A (Reference 1)).

The current sensor that is disclosed in Reference 1 is configured by a conductor and a detection element magnetic sensor pinched by a first fitted portion and a second fitted portion which are fitted into each other and formed of resin. The current to be measured flows through the conductor, and the conductor is inserted into a bottom portion side of a groove portion (corresponding to the "slit" according to this disclosure) of a core. The detection element magnetic sensor (corresponding to the "detection element" according to this disclosure) is arranged further on an opening portion side of the groove portion than the conductor. According to this configuration, the magnetic sensor does not have to be molded in its entirety, and thus a current sensor that minimizes stress applied to the magnetic sensor and the core and entails little post-assembly offset fluctuation and temperature drift is realized.

According to the technique that is disclosed in Reference 1, a magnetic field strength of a gap-direction component of a magnetic field that is generated when the current flows through the conductor significantly changes in an insertion direction of the conductor, and thus an error that is included in a result of the detection of the current increases in a case where a position of the magnetic sensor deviates.

SUMMARY

Thus, a need exists for a current sensor which is not suspectable to the drawback mentioned above.

A feature of a current sensor according to an aspect of this disclosure resides in a configuration that the current sensor includes a U-shaped core as a magnetic body, a conductor inserted into a slit of the core, and a detection element arranged in the slit of the core and detecting a magnetic field, in which the core has recessed portions on both side surfaces facing the detection element and the recessed portions have wall portions intersecting with at least an insertion direction of the conductor.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

A current sensor disclosed here is configured to be capable of accurately measuring a current to be measured that flows through a conductor even in a case where a detection element deviates from a desired position. Hereinafter, a current sensor 100 according to this embodiment will be described. In a case where the current flows through a conductor 20, a magnetic field that has the conductor 20 as its axial center is generated in accordance with a magnitude of the current (Ampere's right hand rule). This current sensor 100 detects a magnetic flux density in the magnetic field and measures the current (current value) that flows through the conductor 20 based on the detected magnetic flux density.

Figure 1:
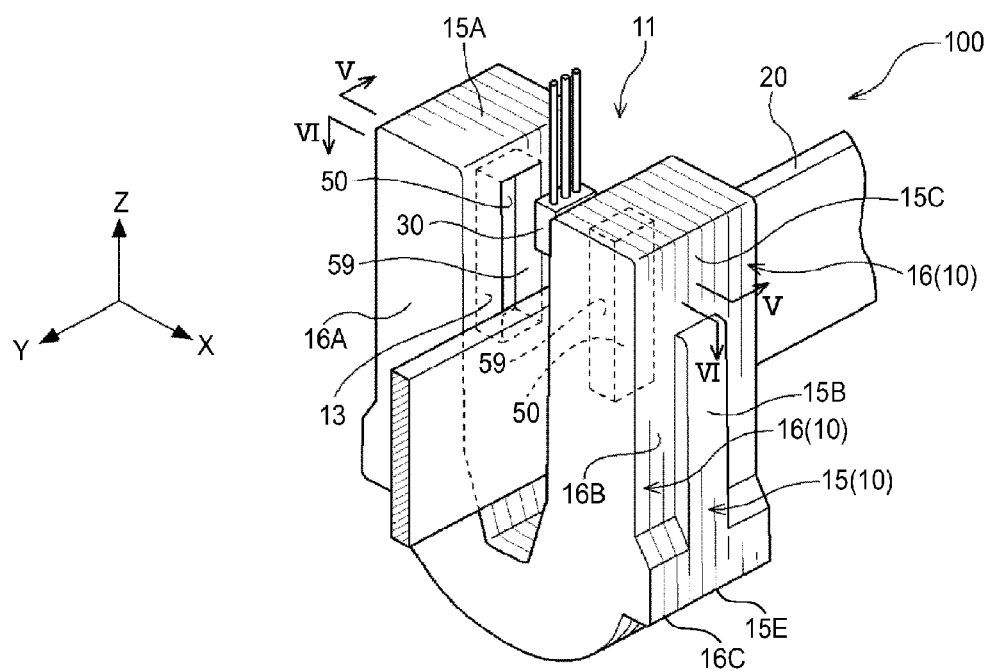
FIG. 1 is a perspective view schematically illustrating a current sensor.
Figure 2:
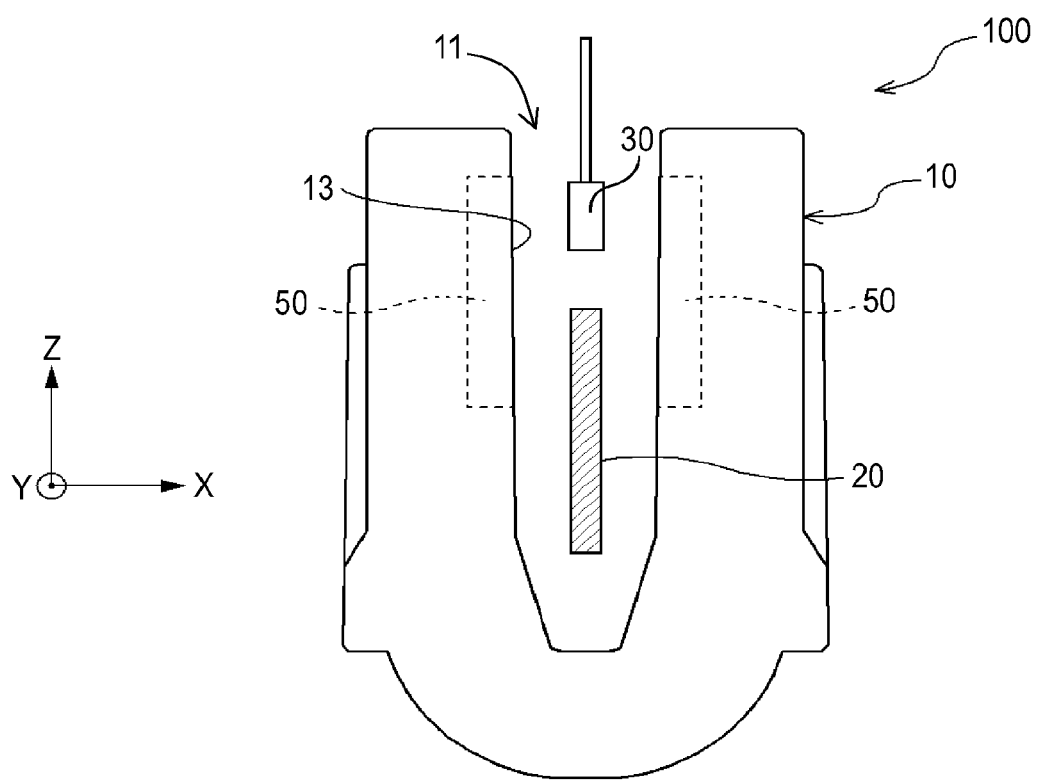
FIG. 2 is a front view schematically illustrating the current sensor.

FIG. 1 is a perspective view of the current sensor 100 according to this embodiment. The flat plate-shaped conductor 20 is illustrated in FIG. 1. In the following description, a thickness direction of the conductor 20 will be referred to as an X direction, a direction in which the conductor 20 extends (extending direction) will be referred to as a Y direction, and a width direction of the conductor 20 will be referred to as a Z direction for ease of understanding. In this embodiment, the X direction, the Y direction, and the Z direction are orthogonal to one another. FIG. 2 is a drawing schematically illustrating the current sensor 100 which is viewed in the Y direction of the conductor 20.

This current sensor 100 is configured to be provided with a core 10, the conductor 20, and a detection element 30. The core 10 is formed as a U-shaped magnetic body. In this embodiment, the core 10 is formed by stacking flat plates that are formed from a metallic magnetic body and have a slit 11. The metallic magnetic body is a soft magnetic metal, and an electromagnetic steel sheet (silicon steel sheet), a permalloy, a permendur, or the like corresponds thereto. The core 10 is formed by punching the flat plates of the metallic magnetic body into a U shape and stacking the punched plates.

Figure 3:
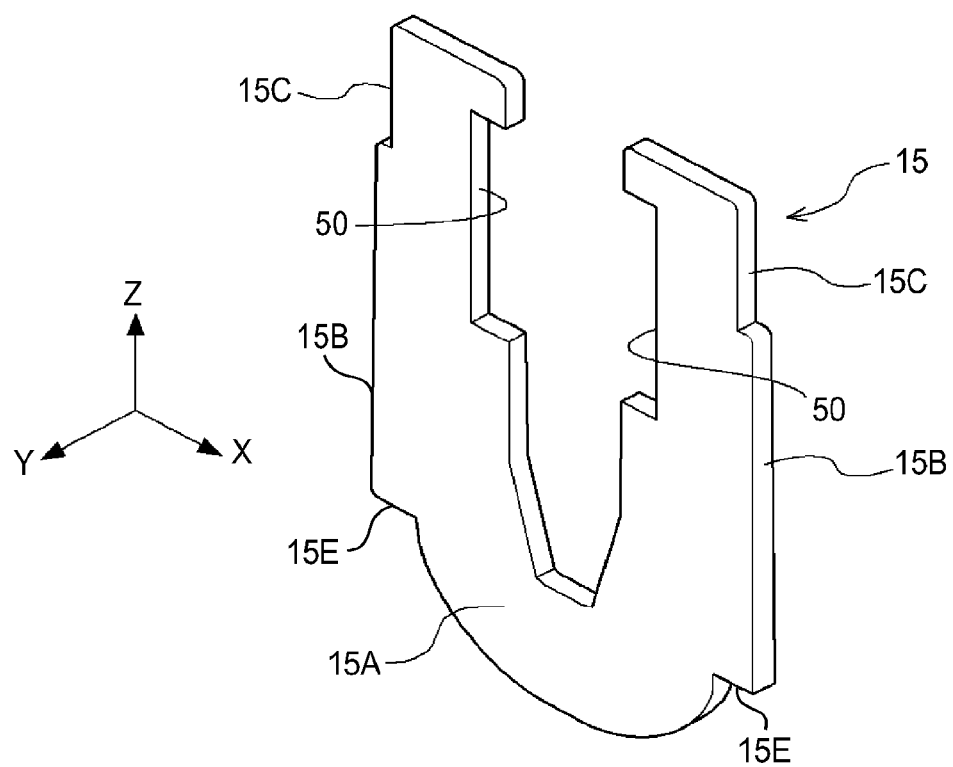
FIG. 3 is a perspective view schematically illustrating a first flat plate.

In this embodiment, the core 10 is configured by stacking a first flat plate 15 and second flat plates 16. As illustrated in FIG. 3, the first flat plate 15 is configured to have a U-shaped portion 15A and protruding portions 15B that protrude in the X direction from side surfaces of the U-shaped portion 15A. The U-shaped portion 15A is a part of the first flat plate 15 that is formed into a U shape when viewed in the Y direction. The side surfaces of the U-shaped portion 15A are side surfaces 15C of the U-shaped portion 15A. Particularly, in this embodiment, the protruding portions 15B are disposed on surfaces of the side surfaces 15C of the U-shaped portion 15A that are orthogonal to the X direction (surfaces that are parallel to a YZ plane). This first flat plate 15 has the U-shaped portion 15A and the protruding portions 15B integrally formed from the metallic magnetic body by punching.

Figure 4:
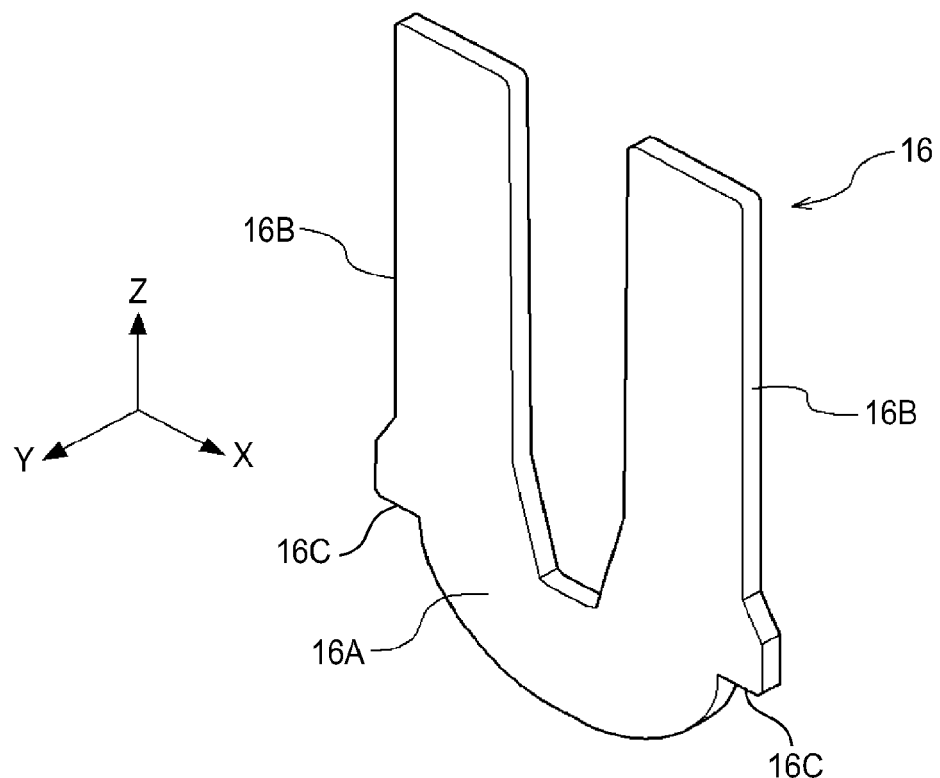
FIG. 4 is a perspective view schematically illustrating a second flat plate.

As illustrated in FIG. 4, the second flat plate 16 is configured to have a U-shaped portion 16A that has the same shape as the U-shaped portion 15A. The U-shaped portion 16A having the same shape as the U-shaped portion 15A means that external dimensions thereof correspond to each other and the U-shaped portion 15A of the first flat plate 15 and the U-shaped portion 16A of the second flat plate 16 correspond to each other when viewed in the Y direction in a case where the first flat plate 15 and the second flat plates 16 are stacked. Shoulder portions 16C are disposed on side surfaces 16B of the U-shaped portion of the second flat plate 16 so that the shoulder portions 16C correspond in the Y direction to shoulder portions 15E of the protruding portions 15B of the first flat plate 15 in a case where the first flat plate 15 and the second flat plates 16 are stacked. A supporting portion of a housing (not illustrated) abuts against and is supported by the shoulder portions 15E of the first flat plate 15 and the shoulder portions 16C of the second flat plate 16.

In this embodiment, the first flat plate 15 and the second flat plates 16 are stacked such that the first flat plate 15 is arranged on a Y-direction central side with the respective U-shaped portions 15A and 16A corresponding to each other. A plane where the first flat plate 15 and the second flat plate 16 are stacked is a plane that is parallel to an XZ plane. Accordingly, the first flat plate 15 and the second flat plates 16 are stacked such that the first flat plate 15 is arranged on the Y-direction central side means that the first flat plate 15 and the second flat plates 16 are stacked with the second flat plates 16 arranged on both Y-direction sides of the first flat plate 15. In other words, as illustrated in FIG. 1, the second flat plate 16 is not arranged further on the Y-direction central side than the first flat plate 15, and the first flat plate 15 and the second flat plates 16 are stacked in the form of second flat plate 16/first flat plate 15/second flat plate 16 in a case where the core 10 is viewed in its entirety.

Referring back to FIG. 1, the current to be measured flows through the conductor 20 and the conductor 20 is configured to have a flat-plate shape. The current to be measured is a current as an object to be detected that is detected by the current sensor 100. The conductor 20 is configured to have an elongated shape that has a predetermined width. The conductor 20 is inserted into the slit 11 of the core 10. As illustrated in FIGS. 1 and 2, the conductor 20 according to this embodiment is inserted into the slit 11 such that a pair of surfaces of the conductor 20 that are parallel to the YZ plane and surfaces of side walls 13 of the core 10 are parallel to each other. The conductor 20 that is inserted into the slit 11 is arranged to be spaced apart from at least inner surfaces (the side walls 13) of the core 10. In this manner, the core 10 and the conductor 20 can be insulated from each other. The conductor 20 is connected in series to a bus bar that connects a three-phase motor (not illustrated) and an inverter energizing the three-phase motor to each other.

The detection element 30 is arranged in the slit 11 of the core 10. The detection element 30 is arranged on a side that is closer to an open end portion of the slit 11 than the conductor 20 is. The detection element 30 that is arranged in the slit 11 of the core 10 and the conductor 20 are configured to have a gap between themselves. In other words, the detection element 30 and the conductor 20 are disposed to be spaced apart from each other. Accordingly, the detection element 30 and the conductor 20 can be insulated from each other. The magnetic field that is generated in response to the current which flows through the conductor 20 is collected in the core 10. The collected magnetic field is a magnetic field in the X direction in the vicinity of where the detection element 30 is arranged.

The detection element 30 is arranged with a detection direction corresponding to the X direction. Accordingly, the detection element 30 can effectively detect the magnetic field that is attributable to the magnetic field which is formed by the current to be measured flowing through the conductor 20.

The core 10 according to this embodiment has recessed portions 50 on surfaces facing the detection element 30. The recessed portions 50 are formed to have wall portions 59 that intersect with at least the Y direction. The surfaces facing the detection element 30 are the side walls 13 described above. Accordingly, the detection element 30 and the pair of side walls 13 are configured to be aligned in an order of one of the side walls 13, the detection element 30, and the other one of the side walls 13. To "have the wall portions 59 that intersect with at least the Y direction" means that the recessed portions 50 are not penetrative at least in the Y direction.

In this embodiment, the recessed portions 50 are disposed in a Y-direction central portion of the core 10. Accordingly, unevenness of an X direction-component magnetic flux that acts on the detection element 30 can be suppressed even in a case where the position of the detection element 30 deviates in the Y direction in the slit 11.

Figure 5:
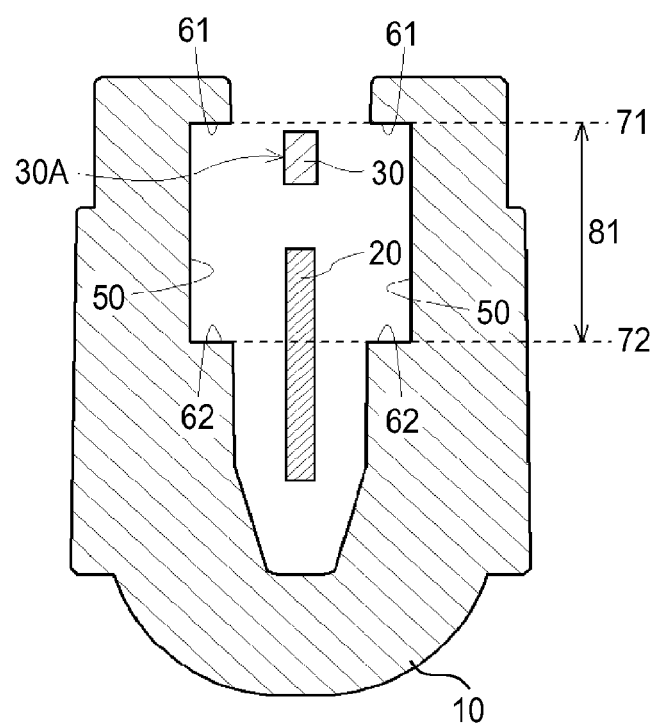
FIG. 5 is a cross-sectional view taken along V-V line in FIG. 1, and illustrating how a detection element is arranged.

In this embodiment, a detection surface 30A of the detection element 30 is arranged in a region 81 as illustrated in FIG. 5 (cross-sectional view taken V-V line in FIG. 1). The region 81 lies between a first straight line 71 and a second straight line 72. The first straight line 71 is a connection between end portions 61 of the recessed portions 50 on both sides that are on the open end side of the slit 11, and the second straight line 72 is a connection between end portions 62 of the recessed portions 50 on both sides that are on a bottom side of the slit 11. Accordingly, the unevenness of the X direction-component magnetic flux that acts on the detection element 30 can be suppressed even in a case where the detection element 30 deviates in the Z direction.

Figure 6:
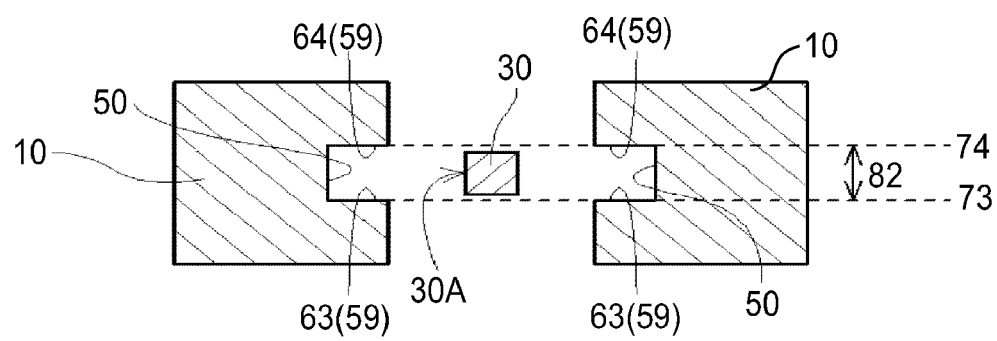
FIG. 6 is a cross-sectional view taken along VI-VI line in FIG. 1, and illustrating how the detection element is arranged.

In this embodiment, the detection surface 30A of the detection element 30 is arranged in a region 82 as illustrated in FIG. 6 (cross-sectional view taken VI-VI line in FIG. 1). The region 82 lies between a third straight line 73 and a fourth straight line 74. The third straight line 73 is a connection between Y-direction wall portions 63 of the recessed portions 50 on both sides, and the fourth straight line 74 is a connection between the other Y-direction wall portions 64 of the recessed portions 50 on both sides. Accordingly, the unevenness of the X direction-component magnetic flux that acts on the detection element 30 can be suppressed even in a case where the detection element 30 deviates in the Y direction.

Figure 7:
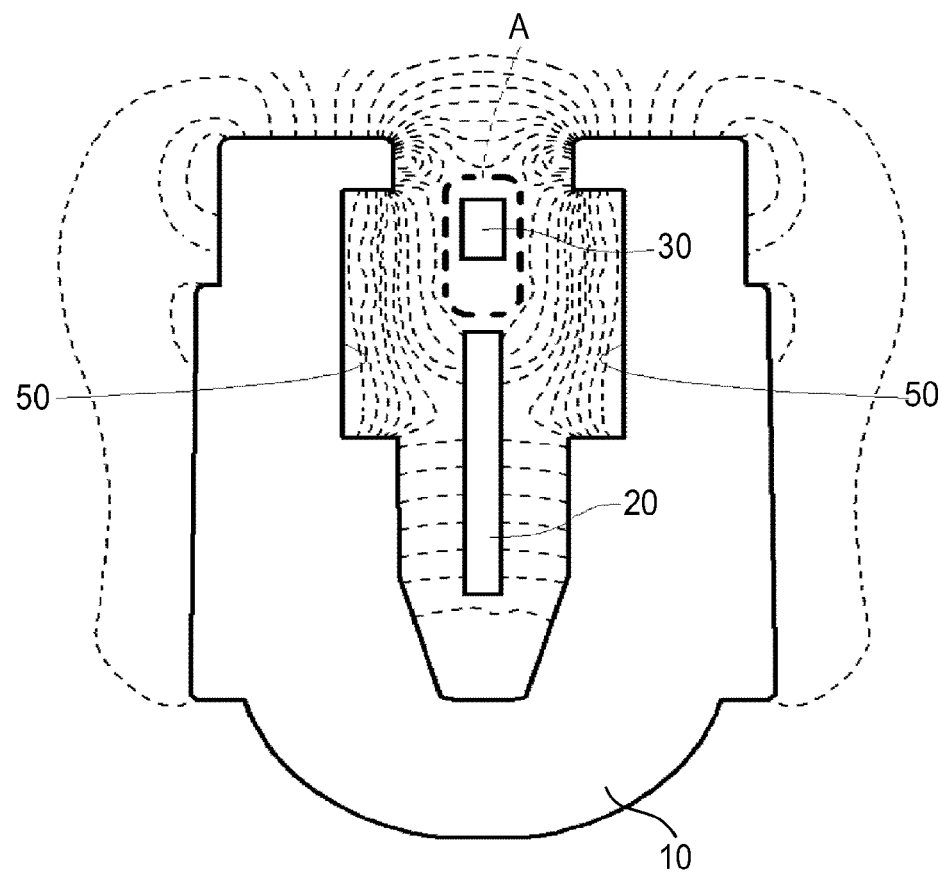
FIG. 7 is a drawing illustrating a strength distribution of a magnetic field generated around a core.
Figure 8:
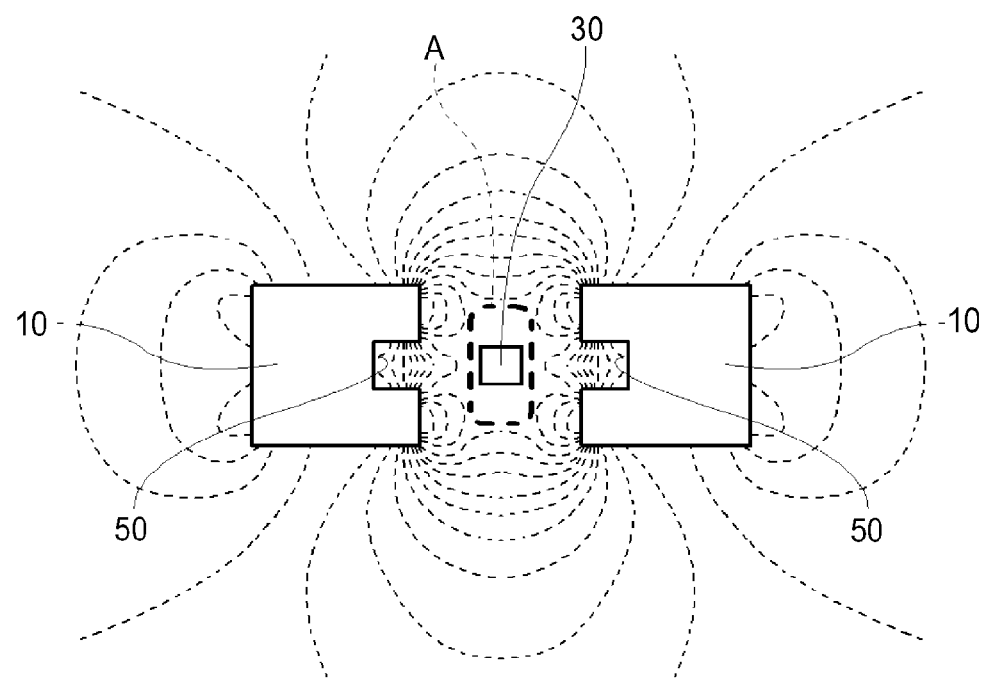
FIG. 8 is a drawing illustrating the strength distribution of the magnetic field generated around the core.

FIGS. 7 and 8 show a strength of an electric field that is generated around the core 10 when a predetermined current flows through the conductor 20. FIG. 7 is a drawing illustrating a strength distribution of a magnetic field generated around the core 10, and FIG. 8 is a drawing illustrating the strength distribution of the magnetic field generated around the core 10. In the example of FIGS. 7 and 8, the same electric field strength is shown in the form of a connected line (hereinafter, referred to as a "strength line") that can be compared to a so-called "contour". Accordingly, FIGS. 7 and 8 show that a place with a wide gap between the strength lines has a small amount of change in the electric field strength and a place with a narrow gap between the strength lines has a large amount of change in the electric field strength.

As is shown as a region A in FIGS. 7 and 8, the place with the wide gap between the strength lines is present at a part where the pair of recessed portions 50 face each other. In this embodiment, the detection element 30 is arranged in this place. Accordingly, the magnetic flux density through the detection element 30 is subjected to no significant change even in a case where the position of the detection element 30 deviates from a desired position, and thus robustness against the deviation can be improved. Accordingly, the current can be accurately detected.

Figure 9:
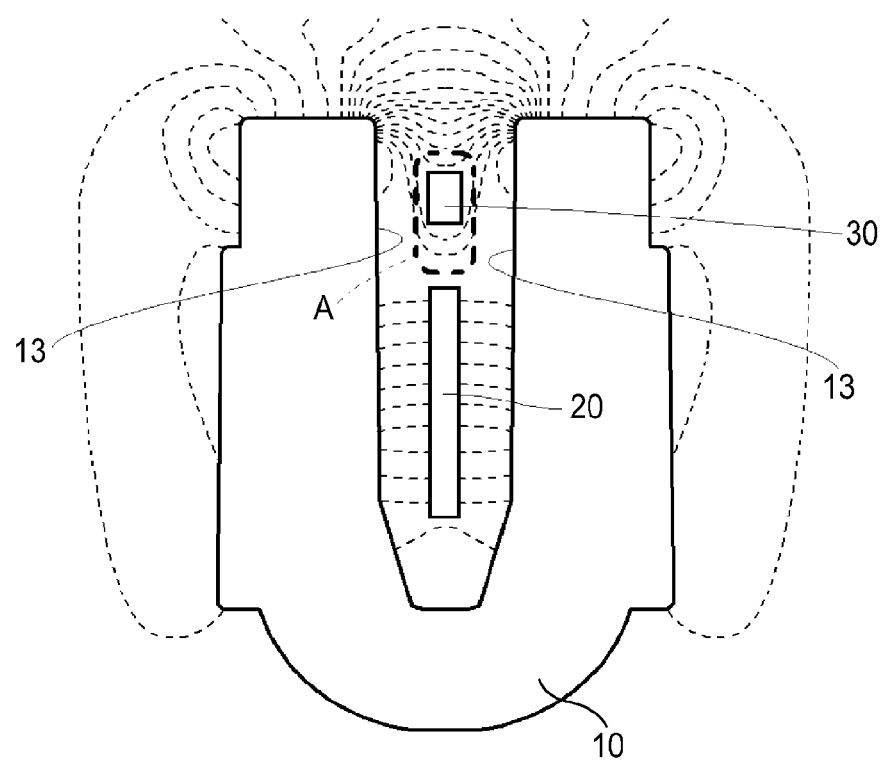
FIG. 9 is a drawing illustrating a strength distribution of a magnetic field generated around a core that has no recessed portion.
Figure 10:
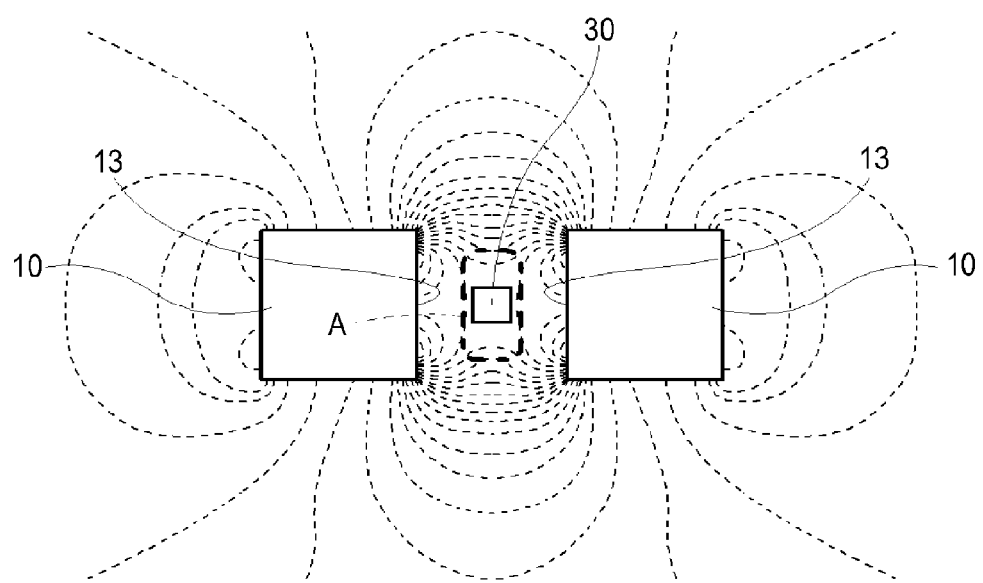
FIG. 10 is a drawing illustrating the strength distribution of the magnetic field generated around the core that has no recessed portion.

A strength of an electric field that is generated around a core 10 which has no recessed portion 50 is illustrated in FIGS. 9 and 10 for comparison. In addition, a region A that has the same size as the region A in FIGS. 7 and 8 is illustrated in FIGS. 9 and 10. In a case where no recessed portion 50 is formed in the core 10, the strength lines around the detection element 30 have a narrower gap than in the case of FIGS. 7 and 8 as illustrated in FIGS. 9 and 10. Accordingly, in a case where the detection element 30 deviates from a desired position, the magnetic flux through the detection element 30 is displaced even in, for example, the region A, and an erroneous detection result could ensue. As described above, according to the present embodiment, the current sensor 100 that has a high level of robustness against the deviation can be configured.

Another Embodiment

According to the above description of the embodiment, the conductor 20 has the flat-plate shape. However, the conductor 20 may have a shape other than the flat-plate shape.

According to the above description of the embodiment, the recessed portions 50 are disposed in the Y-direction central portion of the core 10. However, the recessed portion 50 can also be disposed at a position shifted from the Y-direction central portion. This embodiment can also have the following configuration so that the effects described above are achieved. The recessed portion 50 may be disposed at a position shifted from the central portion to the open side of the slit 11. The detection element 30 and the conductor 20 may be arranged in the region 81 that lies between the first straight line 71 and the second straight line 72. The detection element 30 may be arranged on the first straight line 71 side in the region 81 that lies between the first straight line 71 and the second straight line 72.

According to the above description of the embodiment, the core 10 is formed of the stacked flat plates. However, the core 10 can also be formed by sintering of a magnetic body material.

According to the above description of the embodiment, the detection surface 30A of the detection element 30 is arranged in the region 81 that lies between the first straight line 71 and the second straight line 72 and in the region 82 that lies between the third straight line 73 and the fourth straight line 74. However, the detection surface 30A of the detection element 30 can also be arranged to be provided in at least one of the region 81 and the region 82 or can also be arranged at a position spaced apart from both the region 81 and the region 82.

Figure 11:
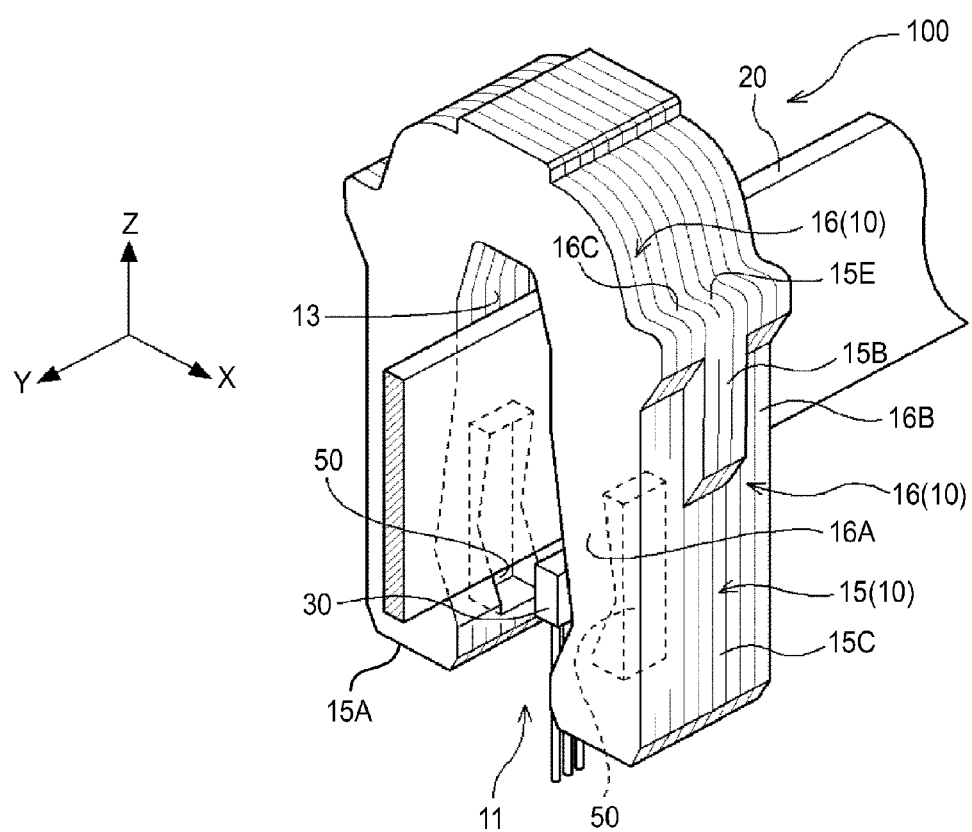
FIG. 11 is a perspective view schematically illustrating a current sensor according to another embodiment.
Figure 12:
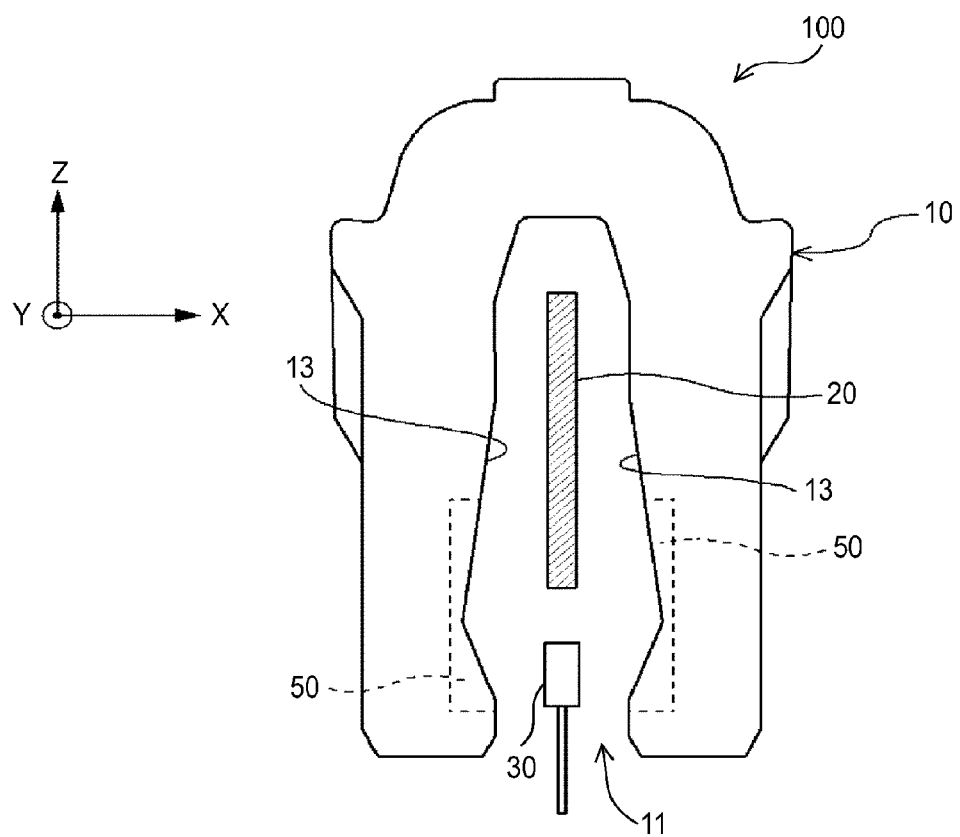
FIG. 12 is a front view schematically illustrating the current sensor according the other embodiment.

According to the above illustration of the embodiment, the side walls 13 of the slit 11 are parallel to each other. However, as illustrated in FIGS. 11 and 12, the surfaces of the slit 11 facing the detection element 30 can also be formed to be nonparallel to each other. In other words, the core 10 can also be formed with the pair of side walls 13 of the slit 11 formed to have a posture inclined in the Z direction. This formation based on the inclined posture allows the unevenness of the X direction-component magnetic flux that acts on the detection element 30 to be suppressed even in a case where the detection element 30 deviates in the Y direction in the slit 11.

What has been disclosed here relates to a current sensor that measures a current which flows through a conductor.

A feature of a current sensor according to an aspect of this disclosure resides in a configuration that the current sensor includes a U-shaped core as a magnetic body, a conductor inserted into a slit of the core, and a detection element arranged in the slit of the core and detecting a magnetic field, in which the core has recessed portions on both side surfaces facing the detection element and the recessed portions have wall portions intersecting with at least an insertion direction of the conductor.

According to this configuration, the amount of change in magnetic field strength in the vicinity of the detection element can be reduced. Particularly, even in a case where the detection element deviates in a depth direction of the slit, an effect attributable to unevenness of a magnetic flux in a depth direction of the recessed portions that acts on the detection element can be suppressed. Accordingly, even in a case where the position of the detection element deviates from a desired position, an effect on the detection by the detection element can be reduced, and thus a current can be accurately measured.

It is preferable that the recessed portions are disposed in a central portion of the core in the insertion direction of the conductor.

According to this configuration, the effect attributable to the unevenness of the magnetic flux in a gap direction of the slit that acts on the detection element can be suppressed even in a case where the detection element deviates in the insertion direction of the conductor in the slit. Accordingly, the current can be accurately measured.

It is preferable that the core is formed of stacked flat plates and the recessed portions are disposed by the stacked flat plates.

According to this configuration, the core can be formed by punching the flat plates of a metallic magnetic body into a U shape and stacking the punched flat plates. Accordingly, the core that has the recessed portions can be manufactured with ease and at a low cost.

It is preferable that a detection surface of the detection element is arranged in a region lying between a first straight line as a connection between end portions of both recessed portions on an open end side of the slit and a second straight line as a connection between end portions of both recessed portions on a bottom side of the slit.

According to this configuration, the effect attributable to the unevenness of the magnetic flux in the gap direction of the slit that acts on the detection element can be suppressed even in a case where the detection element deviates in the depth direction of the slit. Accordingly, the current can be accurately measured.

It is preferable that the detection surface of the detection element is arranged in a region lying between a third straight line as a connection between wall portions of both recessed portions in the insertion direction and a fourth straight line as a connection between the other wall portions of both recessed portions in the insertion direction.

According to this configuration, the effect attributable to the unevenness of the magnetic flux in the gap direction of the slit that acts on the detection element can be suppressed even in a case where the detection element deviates in the insertion direction of the conductor in the slit. Accordingly, the current can be accurately measured.

It is preferable that surfaces of the slit facing the detection element are nonparallel to each other.

According to this configuration, the surfaces of the slit that face each other can be inclined in the depth direction of the slit. Accordingly, the effect attributable to the unevenness of the magnetic flux in the gap direction of the slit that acts on the detection element can be suppressed even in a case where the detection element deviates in the insertion direction of the conductor in the slit. Accordingly, the current can be accurately measured.

It is preferable that the recessed portions are disposed at positions shifted from the central portion to an open side of the slit.

It is preferable that the detection element and the conductor are arranged in the region lying between the first straight line and the second straight line.

It is preferable that the detection element is arranged on the first straight line side in the region lying between the first straight line and the second straight line.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A current sensor comprising:
   a U-shaped core as a magnetic body;
   a conductor inserted into a slit of the core; and
   a detection element arranged in the slit of the core and detecting a magnetic field, wherein
   the core includes recessed portions on both side surfaces facing a detection surface of the detection element,
   the recessed portions have wall portions,
   a plane, which extends along (1) a first wall portion of a first recessed portion on a first side surface of the core and (2) a second wall portion of a second recessed portion on a second side surface of the core that opposes the first side surface, intersects the conductor.

2. The current sensor according to claim 1, wherein the recessed portions are disposed in a central portion of the core in the insertion direction of the conductor.

3. The current sensor according to claim 1, wherein the core is formed of stacked flat plates and the recessed portions are disposed by the stacked flat plates.

4. The current sensor according to claim 1, wherein the detection surface of the detection element is arranged in a region lying between a first straight line as a connection between end portions of the first and second recessed portions on an open end side of the slit and a second straight line as a connection between end portions of the first and second recessed portions on a bottom side of the slit.

5. The current sensor according to claim 4, wherein the detection surface of the detection element is arranged in a region lying between a third straight line as a connection between the first and second wall portions in the insertion direction and a fourth straight line as a connection between third and fourth wall portions in the insertion direction.

6. The current sensor according to claim 4, wherein the detection element and the conductor are arranged in the region lying between the first straight line and the second straight line.

7. The current sensor according to claim 4, wherein the detection element is arranged on the first straight line side in the region lying between the first straight line and the second straight line.

8. The current sensor according to claim 1, wherein surfaces of the slit facing the detection element are nonparallel to each other.

9. The current sensor according to claim 1, wherein the recessed portions are disposed at positions shifted from the central portion to an open side of the slit.

* * * * *